(12) United States Patent
Koike

(10) Patent No.: US 6,201,241 B1
(45) Date of Patent: Mar. 13, 2001

(54) ORGANIC SUBSTANCE ANALYZER

(75) Inventor: Hirotami Koike, Tokyo-to (JP)

(73) Assignee: Kabushiki Kaisha TOPCON, Tokyo-to (JP)

(*) Notice: Subject to any disclaimer, the term of this patent is extended or adjusted under 35 U.S.C. 154(b) by 0 days.

(21) Appl. No.: 09/461,826

(22) Filed: Dec. 15, 1999

Related U.S. Application Data

(63) Continuation of application No. 08/926,355, filed on Sep. 9, 1997, now abandoned.

(30) Foreign Application Priority Data

Sep. 17, 1996 (JP) ............................................. 266691

(51) Int. Cl.$^7$ ...................... H01J 37/252; G01N 23/223
(52) U.S. Cl. ................................. 250/310; 378/45
(58) Field of Search ..................................... 250/306, 310; 378/6, 44–45, 82, 83; 356/308, 301, 303; 422/82.08, 82.09

(56) References Cited

U.S. PATENT DOCUMENTS

| 5,418,826 | 5/1995 | Sato et al. ............................ 378/48 |
|---|---|---|
| 5,425,916 | 6/1995 | Beer et al. ............................ 422/62 |
| 5,596,195 | 1/1997 | Obori et al. .......................... 250/310 |
| 5,635,716 | 6/1997 | Liu et al. ............................. 250/310 |
| 5,674,743 | 10/1997 | Ulmer .............................. 435/287.2 |
| 5,712,165 | 1/1998 | Alvarez et al. ...................... 436/21 |

*Primary Examiner*—Bruce C. Anderson
(74) *Attorney, Agent, or Firm*—Nields & Lemack

(57) ABSTRACT

An organic substance analyzer, which comprises a irradiating unit for irradiating a specimen containing organic substances with an electron beam, a spectrum detecting unit for detecting spectrum of fluorescent light emitted from said specimen, a storage unit for storing a shape of a reference spectrum of fluorescent light of each specific type of organic substance when the electron beam is irradiated on said specific type of organic substance, and a searching unit for classification and identifying organic substances in the specimen by comparing the shape of said stored reference spectrum with that of said detected spectrum, whereby the electron beam having higher energy than light is irradiated the specimen for analysis, fluorescent light with spectrum in wider range is emitted from the specimen even in ultraviolet range, and organic substances in the specimen are discriminated and identified by comparing shapes of the measured spectral pattern obtained from the fluorescent light with a reference spectral pattern stored in memory in advance.

4 Claims, 4 Drawing Sheets

ORGANIC SUBSTANCE ANALYZER

This is a continuation of Ser. No. 08/926,355, filed Sep. 9, 1997, now abandoned.

BACKGROUND OF THE INVENTION

The present invention relates to an analyzer of organic substances for analyzing a specimen containing organic substances by irradiation of electron beam to the specimen and by performing spectroscopy of fluorescent light emitted from the specimen.

As the conventional methods to analyze organic substances, various methods have been known such as nuclear magnetic resonance method (NMR), infrared spectroscopy, Raman spectroscopy, ultraviolet excitation fluorescence spectroscopy, electron spectroscopy for chemical analysis (ESCA) or X-ray photoelectron spectroscopy (XPS), etc.

As a method to identify and discriminate organic substances using the ultraviolet excitation fluorescence spectroscopy, a method described in "Analyzer for Organic Foreign Substances in Micro-Area Using Micro-Fluorescence Spectroscopy" (Hitachi Review issued in Japan, Vol.73, No.9, September 1991) is known.

However, when the above methods such as nuclear magnetic resonance method (NMR), infrared spectroscopy, Raman spectroscopy, ultraviolet excitation fluorescence spectroscopy, or ESCA (XPS) method are used, measurable range on the specimen is as follows: 100 $\mu$m or more in the nuclear magnetic resonance method (NMR), 7 $\mu$m or more in the infrared spectroscopy method, 1 $\mu$m or more in the ultraviolet excitation fluorescence spectroscopy method, 1 $\mu$m or more in the Raman spectroscopy, and 10 $\mu$m or more in the ESCA (XPS) method. In none of the above methods, it is possible to analyze organic substance in micro-area, i.e. in size of 1 $\mu$m or less.

In the method to discriminate and identify organic substances using ultraviolet excitation fluorescence spectroscopy, as seen in the above literature, fluorescence wavelength range of fluorescent light emitted from the specimen under bombardment of ultraviolet ray is narrow. For example, even when ultraviolet ray with wavelength of 360 nm is bombarded, wavelength of the emitted fluorescent light is limited to that of 450 nm or around. This means that there is limitation in the information obtained for identification of the organic substances.

SUMMARY OF THE INVENTION

It is an object of the present invention to provide an analyzer, by which it is possible to perform measurement even in the range of 1 $\mu$m or less, to obtain as much information as required for identification of organic substances, to improve accuracy in classification and identifying the organic substances, and to raise detection efficiency by efficiently converging fluorescent light.

To attain the above object, the analyzer for organic substances according to the present invention comprises a irradiation unit for irradiating a specimen containing organic substances with an electron beam, a spectrum detection unit for detecting spectrum of fluorescent light emitted from the specimen, a storage unit for storing shape of a reference spectrum of fluorescent light when the electron beam is irradiated to a specific organic substance, and a searching unit for classification and identifying organic substances in the specimen by comparing the shape of the reference spectrum stored with the detected spectrum. Also, in the analyzer for organic substances of the present invention, comparison of shapes of the spectra is performed at least by comparing number of spectral peaks, wavelength at position of each peak, half width value of each peak, and difference or ratio of peak values. Further, in the analyzer of organic substances of the present invention, comparison of shapes of spectrum is performed by taking the change of spectral shape due to damage caused by the electron beam bombardment into account. Further, in the analyzer for organic substances of the present invention, the storage unit also stores reference spectrum of characteristic X-ray generated when the electron beam is bombarded each specific type of substance. Also, in the analyzer of organic substances of the present invention, a reflective optical element is arranged on an optical axis between the specimen and the spectrum detecting unit and the reflective optical element comprises an entry transmitting surface, an exit transmitting surface in shape of a slit designed with the shape of the entry transmitting surface compressed at least in one direction, and a reflection surface which is provided around an optical axis between the entry transmitting surface and the exit transmitting surface and is used for reflecting fluorescent light and guiding it toward the exit transmitting surface. According to the present invention, the electron beam is irradiated and fluorescent light emitted under bombardment of the electron beam is analyzed to discriminate and identify the organic substances. Even in the range of 1 $\mu$m or less, measurement can be performed. It is possible to perform measurement in the range of micro-area, and the electron beam having higher energy than light is irradiated for analysis. Therefore, even in ultraviolet range, fluorescent light with spectrum in wide range is emitted from the specimen, and it is possible to obtain much information and to improve accuracy in classification and identifying organic substances.

DETAILED DESCRIPTION OF THE PREFERRED EMBODIMENTS

Figure 1:
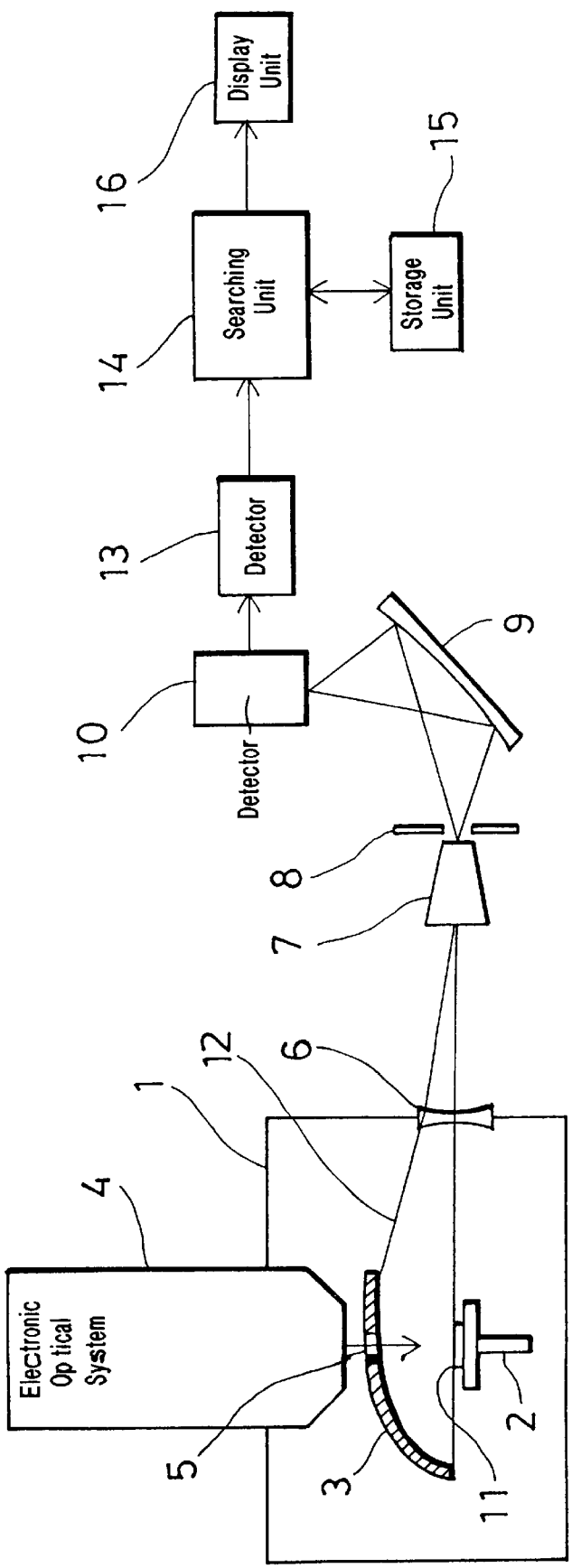
FIG. 1 is a schematical drawing of an arrangement of an embodiment of the present invention.

In the following, description will be given on embodiments of the present invention referring to the attached drawings.

In a vacuum specimen chamber 1, a specimen stand 2 is disposed, on which a specimen 11 is placed. The specimen stand 2 is movable in two directions, i.e. in the horizontal direction X-Y and is also movable in the vertical direction. To the specimen stand 2, a condensing mirror 3 with elliptical curve surface is arranged. On the opposite side of the condensing mirror 3 as seen from the specimen stand 2, an electronic optical system 4 including an electron gun is provided. On the condensing mirror 3, a hole 5 is formed so that an electron beam from the electronic optical system 4 can pass through it. In the electronic optical system 4, there are provided, in addition to the system itself, a condenser lens for concentrating an electron beam, a deflection coil for scanning, etc., but these are not shown in the figure.

On a side wall of the vacuum specimen chamber 1 opposite to the condensing mirror 3, an exit window is arranged on reflection optical axis of the condensing mirror 3, and a concave lens 6 is disposed at the exit window for the purpose of allowing fluorescent light to pass and of serving as vacuum sealing. Outside the vacuum specimen chamber 1 and on optical axis of reflection light from the condensing mirror 3, a reflective optical element 7, a diaphragm 8, and a spectroscope 9 are arranged in this order as seen from the direction of the concave lens 6. Opposed to the spectroscope 9 and on the exit plane of the spectroscope 9, a multi-channel detector 10 is installed. The multi-channel detector 10 is provided with a line sensor, which comprises a number of photoelectric elements arranged along a straight line, or with a planar photodetection sensor, which comprises a number of photoelectric elements arranged in 2-dimensional configuration. Detection signal from the multi-channel detector 10 is inputted to a spectrum detector 13, and the result of detection of the spectrum detector 13 is inputted to a comparing and searching unit 14. A spectrum storage unit 15 is connected to the comparing and searching unit 14. In the spectrum storage unit 15, spectral patterns serving as the reference for comparison, i.e. spectral patterns detected in advance for various types of organic substances, are set as reference spectral patterns. Separately from the spectroscope 9 for analysis of fluorescent light and the multi-channel detector 10, an analyzer for detecting X-ray spectrum emitted from the specimen under bombardment of electron beam is prepared. By simultaneous use of X-ray spectrum, additional information showing difference of elements is obtained, and this makes the measurement and identification of the specimen more accurate. Specifically, there are macromolecular compounds which contain S, F, Si or Cl. In macromolecular substances derived from living organism such as hair, dandruff, etc., the elements such as Cl, Ca, S, K, Na, etc. can be detected, and this provides more effective measurement and identification. In this case, reference spectrum of fluorescent light and reference spectrum of characteristic X-ray to match each type of substance are stored in advance in the spectrum storage unit 15. By comparing the measured fluorescent light spectrum and X-ray spectrum with each of the spectra stored in the spectrum storage unit 15, the substances are discriminated and identified. The result of the judgment of the comparing and searching unit 14 is displayed on a display unit 16.

The reflective optical element 7 has its entry end surface in circular shape and its exit end surface in shape of a knife edge (slit-like shape). It is in shape of a prism or a hollow body, which is gradually flattened in one direction from the entry end surface toward the exit end surface. In case the reflective optical element 7 is in form of a prism, it is made of a material which allows at least fluorescent light emitted from the specimen 11 to pass. Except the entry end surface and the exit end surface, a reflection layer is coated on the surface, e.g. aluminum is deposited by vacuum evaporation. In case the reflective optical element 7 is a hollow body, reflection layer, e.g. aluminum deposition layer, is formed on the inner wall surface. On the diaphragm 8, a slit of almost the same size as that of the exit end surface of the reflective optical element 7 is provided.

The position of the reflective optical element 7 with respect to a measuring light beam 12 is determined in such a manner that the entry position of the measuring light beam 12 correspond with the entry end surface. Optical axis of the measuring light beam 12 may not necessarily correspond with optical axis of the reflective optical element 7, and no strict accuracy is required on the arrangement of the reflective optical element 7.

In the following, description will be given on operation.

When the electron beam is irradiated to the specimen 11 on the specimen stand 2, fluorescent light is emitted from the specimen 11. The fluorescent light is concentrated by the condensing mirror 3 and is reflected toward the concave lens 6. The fluorescent light concentrated and reflected by the condensing mirror 3, i.e. the measuring light beam 12, passes through the concave lens 6, and its spreading angle of the measuring light beam 12 is narrowed down, and a concentrating point is moved further.

After entering the reflective optical element 7, the measuring light beam 12 is reflected two or more times by the surface of the reflective optical element 7, which is gradually flattened, and the beam is irradiated from the exit end surface. If shape and area of the entry end surface of the reflective optical element 7 are determined in accordance with the condition of the measuring light beam 12, which enters through the concave lens 6, the measuring light beam 12 entering from the entry end surface of the reflective optical element 7 is totally emitted from the exit end surface while eliminating waste. By passing through the diaphragm 8, disturbance light around the measuring light beam 12 is removed, and the measuring light beam 12 can be effectively irradiated toward the spectroscope 9.

The spectroscope 9 separates the measuring light beam 12 into spectral components, and the separated light beams are concentrated on different photodetection elements of the multi-channel detector 10. Each of the photodetection elements of the multi-channel detector 10 outputs a signal, corresponding to light intensity at wavelength of the separated light, to the spectrum detector 13, and the spectrum detector 13 outputs measured spectral pattern, i.e. output values at all wavelengths, from the detection result of the spectrum detector 13 to the comparing and searching unit 14. The comparing and searching unit 14 stores the measured spectral pattern to the spectrum storage unit 15 for once.

As described above, the reference spectral pattern obtained under bombardment of the electron beam is set in advance and inputted for each substance in the spectrum storage unit 15. The measured spectral pattern is compared with the preset reference spectral pattern by pattern patching or other method, and an organic substance to match the measured spectral pattern is discriminated and identified.

Instead of comparing the measured spectral pattern directly with the reference spectral pattern by pattern matching and other method as described above, the factors as given below for each substance may be stored in form of a table, and by comparing these factors, organic substances may be discriminated and identified.

(1) Number of Peaks

Depending on number of peaks and peak values, high peak value at relatively high level is marked with ⊚. As the level of peak values becomes lower, middle peak value is marked with ○ and low peak value is marked with Δ.

(2) Wavelength of Peak

Wavelength of each peak is indicated.

(3) Half Width Value of Peak

As to be described later, it has been demonstrated that half width value of each peak does not show much change even when the specimen is damaged by bombardment of the electron beam. Even among the organic substances, which have similarities in number of peaks and peak wavelength in spectral pattern, there are distinct difference in the half width value of each peak. By taking the factor of the half width value into account, it is possible to discriminate and identify organic substances with higher accuracy.

(4) Ratio of Peak Values

This is the ratio of the peak values at the highest level to the other peak value. By this ratio, it is possible to discriminate and identify organic substances with higher accuracy even when the substances have similarities in number of peaks and wavelength at peak.

The present inventors have experimentally confirmed that, when fluorescent light spectrum of each type of organic substances is detected and when the above factors of each substance are checked according to the fluorescent light spectrum and are compared with the factors of the reference spectrum, it is possible to distinctly discriminate and identify organic substances even when these substances have similar spectral patterns. If the substances are compared in the above factors, capacity of the spectrum storage unit 15 for storing the reference spectral patterns can be reduced, and comparative calculation at the comparing unit can be easily performed, and it is possible to discriminate and identify organic substances within shorter time.

When irradiated with the electron beam, the specimen 11 may be damaged, and the measured spectral pattern obtained under bombardment of the electron beam thereafter may show some change compared with the measured spectral pattern initially obtained. If the change of spectrum caused by bombardment of the electron beam is stored in memory and the stored spectral changes are compared, it is possible to discriminate and identify organic substances with still higher accuracy.

Examples of spectral patterns of organic substances and detection results of each of the factors are shown in FIGS. 2 to 7.

In the spectral diagrams shown in the figures, the scales of fluorescent light intensity are adjusted as appropriate to facilitate the comparison of the measured spectral pattern initially obtained with the measured spectral pattern obtained later, i.e. at the second time, on the damaged specimen.

Figure 2:
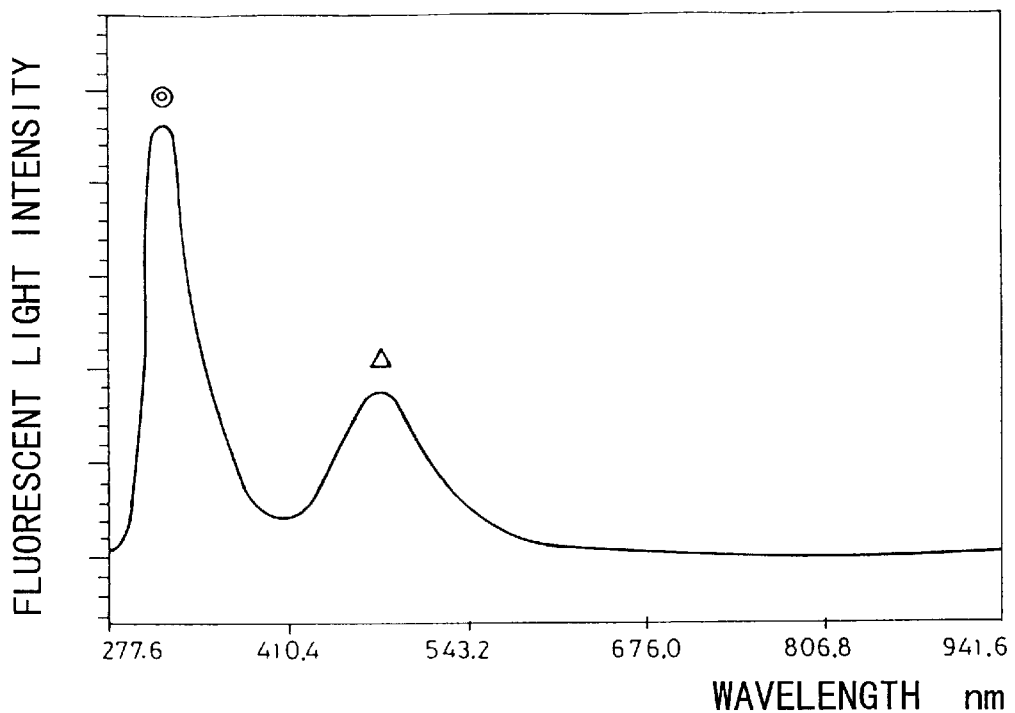
FIG. 2 represents a spectral diagram of polyether sulfone, to which the present invention is applied.

FIG. 2 shows spectrum of polyether sulfone. In the measured spectral pattern, number of peaks, peak values, half width values of peaks, and ratio of peak values are as follows:

| Number of peaks | 2 | |
| --- | --- | --- |
| Peak values | ⊙ | Δ |
| wavelength of peak value (nm) | 330 | 477.3 |
| Half width values of peaks | 43.3 | 90.75 |
| Ratio of peak values | 0.33 | |

Figure 3:
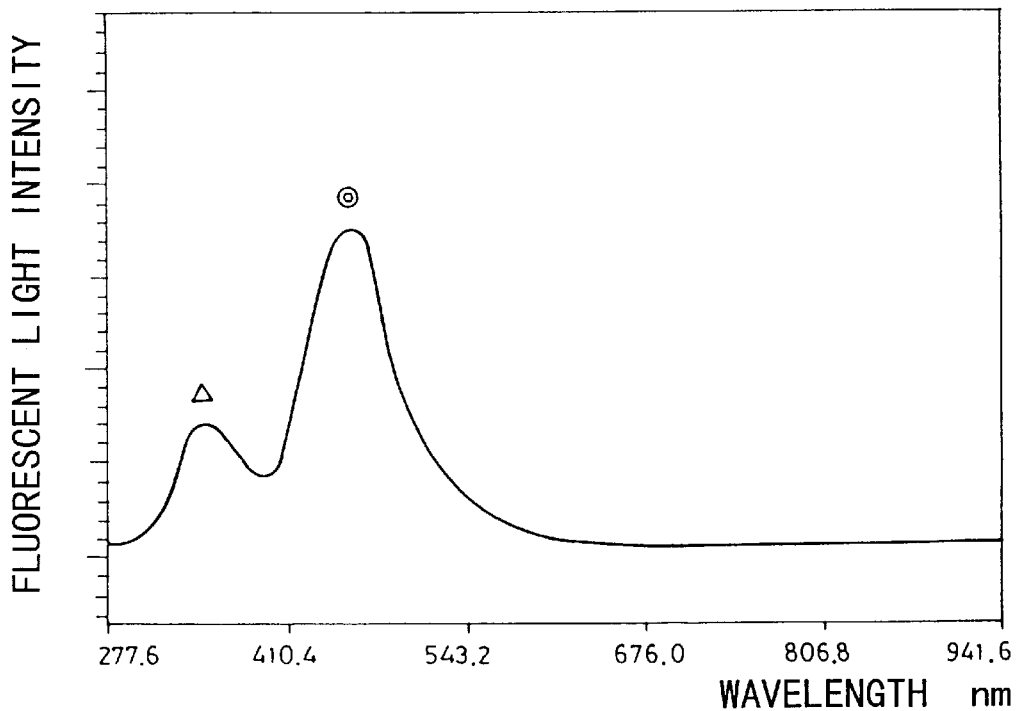
FIG. 3 represents a spectral diagram of polysulfone, to which the present invention is applied.

FIG. 3 represents spectrum of polysulfone. In the measured spectral pattern, number of peaks, peak values, half width values of peaks, ratio of peak values (subsequent peak value/initial peak value) are as follows:

| Number of peaks | 2 | |
| --- | --- | --- |
| Peak values | Δ | ⊙ |
| Wavelength of peak value (nm) | 351.2 | 457.1 |
| Half width values of peaks | 57.7 | 73.4 |
| Ratio of peak values | 2.75 | |

Figure 4:
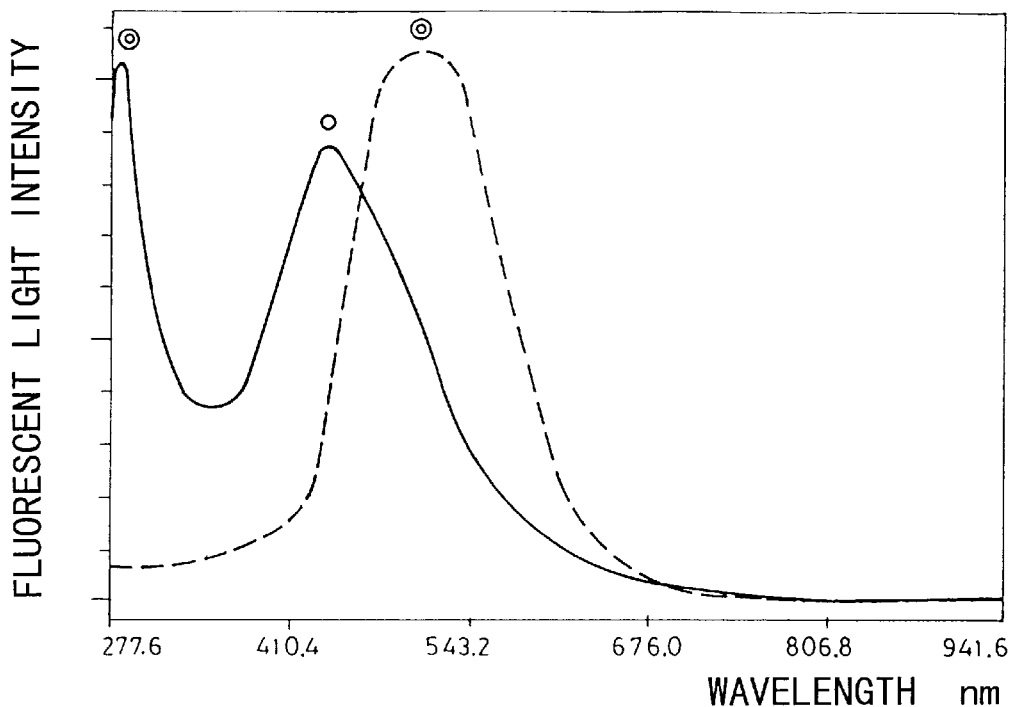
FIG. 4 represents a spectral diagram of polyethylene, to which the present invention is applied.

FIG. 4 represents spectrum of polyethylene. Solid line shows the measured spectral pattern initially obtained, and broken line indicates the measured spectral pattern obtained at the second measurement. In the measured spectral pattern initially obtained, number of peaks, peak values, half width values of peaks, and ratio of peak values are as follows:

| Number of peaks | 2 | |
| --- | --- | --- |
| Peak values | ⊙ | ○ |
| Wavelength of peak value (nm) | 289 | 441 |
| Half width values of peaks | 41 | 130 |
| Ratio of peak values | 0.88 | |

In the spectral pattern obtained at the second measurement, number of peaks, peak values, half width values of peaks, ratio of peak values and change caused by damage are as follows:

| Number of peaks | 1 |
| --- | --- |
| Peak values | ⊙ |
| Wavelength of peak value (nm) | 510 |
| Half width values of peaks | 130 |
| Ratio of peak values | |

Change caused by damage

The first two peaks seen in the initial spectrum disappeared in the second spectrum, and one peak appeared on long wavelength range instead.

Figure 5:
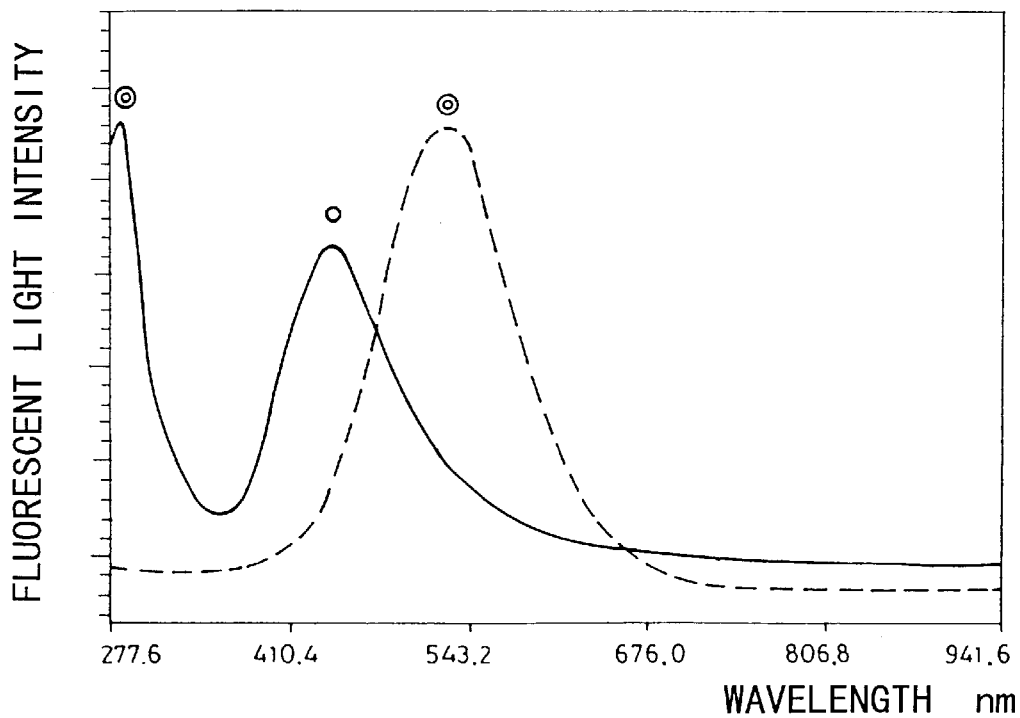
FIG. 5 represents a spectral diagram of polypropylene, to which the present invention is applied.

FIG. 5 represents spectrum of polypropylene. Solid line indicates the measured spectral pattern initially obtained, and broken line shows the measured spectral pattern obtained at the second measurement. In the initial measured spectral pattern, number of peaks, peak values, half width values of peaks, and ratio of peak values are as follows:

| Number of peaks | 2 | |
| --- | --- | --- |
| Peak values | ⊙ | ○ |
| Wavelength of peak value (nm) | 283 | 438 |
| Half width values of peaks | 28.8 | 86.6 |
| Ratio of peak values | 0.87 | |

In the spectral pattern obtained at the second measurement, number of peaks, peak values, half width values of peaks, ratio of peak values and change caused by damage are as follows:

| Number of peaks | 1 |
| --- | --- |
| Peak values | ⊙ |
| Wavelength of peak value (nm) | 519 |
| Half width values of peaks | 115 |
| Ratio of peak values | |

Change caused by damage

The first two peaks seen in the initial spectrum disappeared in the second spectrum, and one peak value appeared on long wavelength range instead.

Figure 6:
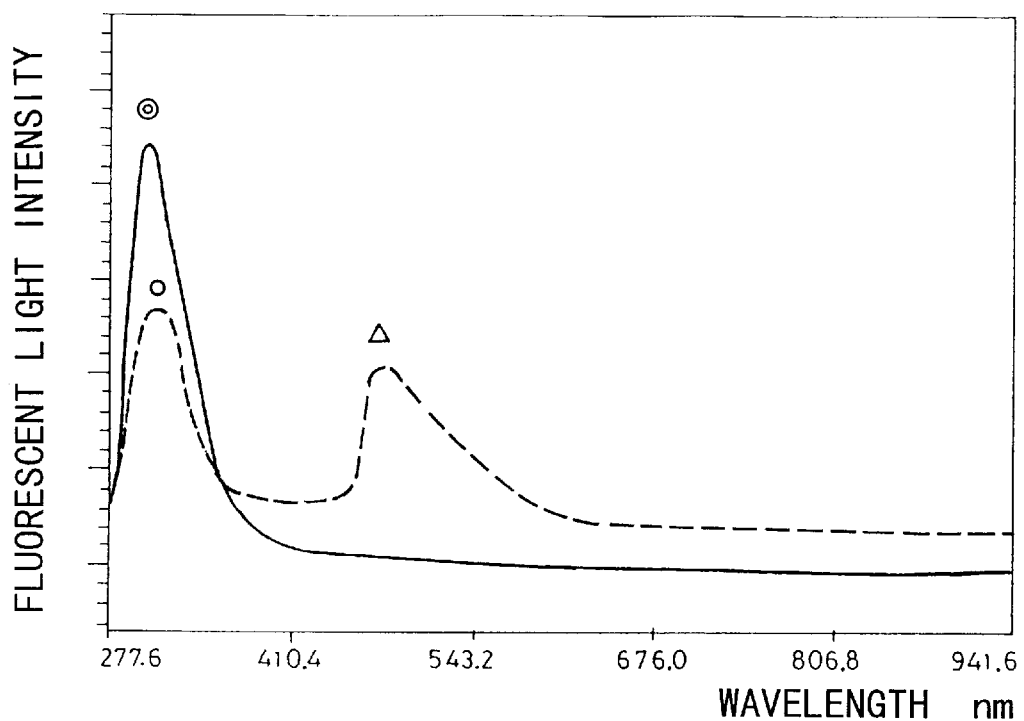
FIG. 6 represents a spectral diagram of polystyrene, to which the present invention is applied.

FIG. 6 represents spectrum of polystyrene. Solid line shows the measured spectral pattern initially obtained, and broken line indicates the measured spectral pattern obtained at the second measurement. In the measured spectral pattern initially obtained, number of peaks, peak values, half width values of peaks, and ratio of peak values are as follows:

| | |
|---|---|
| Number of peaks | 1 |
| Peak values | ⊙ |
| Wavelength of peak value (nm) | 309 |
| Half width values of peaks | 46.2 |
| Ratio of peak values | |

In the spectral pattern obtained at the second measurement, number of peaks, peak values, half width values of peaks, ratio of peak values and change caused by damage are as follows:

| | | |
|---|---|---|
| Number of peaks | 2 | |
| Peak values | ○ | Δ |
| Wavelength of peak value (nm) | 309 | 481 |
| Half width values of peaks | 46 | 71.5 |
| Ratio of peak values | 15.2 | |

Change caused by damage

The peak value seen in the first spectrum is lower in the second spectrum, and a second peak appeared at wavelength of 481 nm in the second spectrum.

Figure 7:
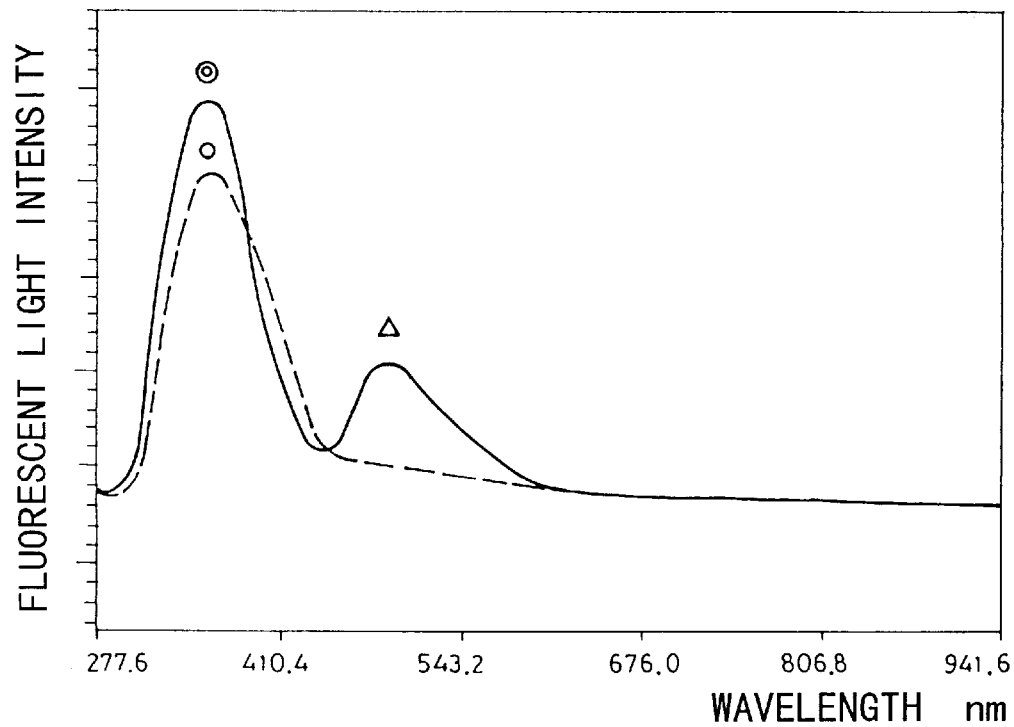
FIG. 7 represents a spectral diagram of polyethylene terephthalate, to which the present invention is applied.

FIG. 7 represents spectrum of polyethylene terephthalate. Solid line indicates the measured spectral pattern initially obtained, and broken line indicates the measured spectral pattern obtained at the second time. In the measured spectral pattern initially obtained, number of peaks, peak values, half width values of peaks, and ratio of peak values are as follows:

| | | |
|---|---|---|
| Number of peaks | 2 | |
| Peak values | ⊙ | Δ |
| Wavelength of peak value (nm) | 355.8 | 491 |
| Half width values of peaks | 92.8 | 144 |
| Ratio of peak values | 0.18 | |

In the spectral pattern obtained at the second measurement, number of peaks, peak values, half width values of peaks, ratio of peak values and change caused by damage are as follows:

| | |
|---|---|
| Number of peaks | 1 |
| Peak values | ○ |
| Wavelength of peak value (nm) | 355.8 |
| Half width values of peaks | 92.8 |
| Ratio of peak values | |

Change caused by damage

In the second spectrum, the first peak value seen in the initial spectrum became lower, and the second peak value seen in the initial spectrum disappeared.

The reference spectral patterns shown in FIGS. 2 to 7 are stored in the spectrum storage unit 15, and the measured spectral patterns obtained under bombardment of the electron beam on the specimen 11 are compared with the reference spectral patterns by pattern matching, or the factors of spectrum such as number of peaks, peak values, wavelength of peak value, half width values of peaks, ratio of peak values, and change caused by damage, are compared, and it is possible to discriminate and identify the substances in the specimen.

As described above, it is possible according to the present invention to analyze the specimen in the range in micro-area because the specimen is analyzed using an electron beam. Because the electron beam has higher energy than light, fluorescent light with spectrum in wider range can be obtained from the specimen irradiated with the electron beam even in ultraviolet range. Thus, it is possible to discriminate and identify organic substances with higher accuracy. Because a reflective optical element with its exit end surface designed in shape of a slit is used, fluorescent light can be converged effectively, and this contributes to improvement of detection efficiency.

What I claim is:

1. An organic substance analyzer, comprising an irradiating unit for irradiating a specimen containing organic substances with an electron beam, a spectrum detecting unit for detecting spectrum of fluorescent light emitted from said specimen, a storage unit for storing a shape of a reference spectrum of fluorescent light of each specific type of organic substance when the electron beam is irradiated on said specific type of organic substance, and a searching unit for classifying and identifying organic substances in the specimen by comparing the shape of said stored reference spectrum with that of said detected spectrum, and a reflective optical element arranged on an optical axis between said irradiating unit and said spectrum detecting unit, wherein said reflective optical element comprises an entry transmitting surface, an exit transmitting surface in the form of a slit with said entry transmitting surface compressed at least in one direction, and a reflection surface which is arranged around an optical axis between said entry transmitting surface and said exit transmitting surface and is used for reflecting fluorescent light and for guiding the light toward said exit transmitting surface.

2. An organic substance analyzer according to claim 1, wherein the comparison of shapes is performed by comparing the number of peaks, the wavelengths of each peak position, the half width values of peaks, and the difference or ratio of peak values of the spectra.

3. An organic substance analyzer according to claim 2, wherein the comparison of shapes is performed by comparison, considering the change of spectral shape due to damage of the specimen by the electron beam bombardment.

4. An organic substance analyzer according to claim 1, wherein said storage unit also stores a reference spectrum of characteristic X-ray generated when the electron beam is bombarded on each specific type of substance.

* * * * *